United States Patent
Hsu et al.

(10) Patent No.: US 7,301,219 B2
(45) Date of Patent: Nov. 27, 2007

(54) ELECTRICALLY ERASABLE PROGRAMMABLE READ ONLY MEMORY (EEPROM) CELL AND METHOD FOR MAKING THE SAME

(75) Inventors: Tzu-Hsuan Hsu, Hsinchu (TW); Yen-Hao Shih, Hsinchu (TW); Ming-Hsiu Lee, Hsinchu (TW)

(73) Assignee: Macronix International Co., Ltd. (TW)

( * ) Notice: Subject to any disclaimer, the term of this patent is extended or adjusted under 35 U.S.C. 154(b) by 131 days.

(21) Appl. No.: 11/146,777

(22) Filed: Jun. 6, 2005

(65) Prior Publication Data

US 2006/0284243 A1   Dec. 21, 2006

(51) Int. Cl.
- *H01L 29/00* (2006.01)
- *H01L 27/108* (2006.01)
- *H01L 29/76* (2006.01)
- *H01L 29/94* (2006.01)
- *H01L 31/119* (2006.01)

(52) U.S. Cl. ............ 257/547; 257/297; 257/327; 257/336; 257/344; 257/349; 257/405; 257/406; 257/408; 257/410; 257/411; 257/639; 257/649; 257/760; 257/900

(58) Field of Classification Search ......... 257/327, 257/336, 344, 405–406, 408, 410, 411, 639, 257/649, 760, 900, 297, 349, 547
See application file for complete search history.

(56) References Cited

U.S. PATENT DOCUMENTS

| | | | |
|---|---|---|---|
| H986 H * | 11/1991 | Codella et al. | 257/344 |
| 5,378,909 A * | 1/1995 | Chang et al. | 257/316 |
| 6,171,913 B1 | 1/2001 | Wang et al. | |
| 6,175,519 B1 | 1/2001 | Lu et al. | |
| 6,177,703 B1 | 1/2001 | Cunningham | |
| 6,278,162 B1 * | 8/2001 | Lien et al. | 257/408 |
| 6,331,952 B1 * | 12/2001 | Wang et al. | 365/185.29 |
| 6,566,699 B2 | 5/2003 | Eitan | |
| 6,570,790 B1 | 5/2003 | Harari | |
| 6,768,165 B1 * | 7/2004 | Eitan | 257/324 |
| 6,963,508 B1 * | 11/2005 | Shone | 365/185.28 |
| 7,042,055 B2 * | 5/2006 | Saito et al. | 257/410 |
| 7,138,692 B2 * | 11/2006 | Tamura et al. | 257/412 |
| 7,161,203 B2 * | 1/2007 | Basceri et al. | 257/296 |
| 2001/0019869 A1 * | 9/2001 | Hsu | 438/286 |
| 2003/0001206 A1 * | 1/2003 | Negoro et al. | 257/336 |
| 2003/0042557 A1 * | 3/2003 | Shimamoto et al. | 257/406 |
| 2004/0094813 A1 * | 5/2004 | Moore | 257/411 |
| 2004/0238905 A1 * | 12/2004 | Chen et al. | 257/411 |
| 2006/0146614 A1 * | 7/2006 | Lue et al. | 365/185.28 |
| 2006/0151846 A1 * | 7/2006 | Callegari et al. | 257/411 |
| 2007/0117323 A1 * | 5/2007 | Yeh | 438/261 |

* cited by examiner

*Primary Examiner*—Ida M. Soward
(74) *Attorney, Agent, or Firm*—Martine Penilla & Gencarella, LLP

(57) ABSTRACT

An asymmetrically doped memory cell has first and second N+ doped junctions on a P substrate. A composite charge trapping layer is disposed over the P substrate and between the first and the second N+ doped junctions. A N– doped region is positioned adjacent to the first N+ doped junction and under the composite charge trapping layer. A P– doped region is positioned adjacent to the second N+ doped junction and under the composite charge trapping layer. The asymmetrically doped memory cell will store charges at the end of the composite charge trapping layer that is above the P– doped region. The asymmetrically doped memory cell can function as an electrically erasable programmable read only memory cell, and is capable of multiple level cell operations. A method for making an asymmetrically doped memory cell is also described.

42 Claims, 3 Drawing Sheets

|  | BDL(v) | BS(v) | BDR(v) | WL(v) |
|---|---|---|---|---|
| BTBT HH Erase | 0 | 5 | Floating | -5 |
| CHE Program | 0 | 5 | Floating | 10 |
| Read (forward) | 0 | 1 | Floating | 5 |
| Read (Reverse) | 1 | 0 | Floating | 5 |

FIG. 3

ELECTRICALLY ERASABLE PROGRAMMABLE READ ONLY MEMORY (EEPROM) CELL AND METHOD FOR MAKING THE SAME

BACKGROUND OF THE INVENTION

1. Field of the Invention

The present invention relates generally to a memory device, and more particularly, to an electrically erasable and programmable read only memory (EEPROM) cell and a method for making such a memory cell.

2. Description of the Related Art

Electrically erasable programmable read only memory (EEPROM) cells are widely used in semiconductor industry. As is well known in the art, a conventional floating gate EEPROM cell includes a storage transistor and a select transistor, which results in a large memory cell size and low memory array density. Because of the floating gate structure, a conventional EEPROM cell needs to undergo double-poly processes for fabricating its floating gate and control gate. This makes the fabrication process of a conventional EEPROM cell complicate and expensive. The double-poly processes also make the fabrication process of the conventional EEPROM cells difficult to be integrated with the standard complementary metal oxide semiconductor (CMOS) logic process.

For conventional EEPROM array structures, isolation structures, such as isolation field oxide regions and isolation electrical lines, need to be used to isolate two adjacent EEPROM cells in order to overcome the program/erase disturb problems. The isolation field oxide regions of a conventional EEPROM array reduce the array density. Furthermore, the use of the isolation field oxide regions between adjacent EEPROM cells in the EEPROM array makes the surface of the EEPROM array scabrous, leading to a smaller process window for photoresist and etch processes. Moreover, the isolation electrical lines of the EEPROM array make the periphery circuit complex.

In view of the foregoing, there is a need for improved EEPROM cells that have small cell sizes, a single poly process, and compact array structures.

SUMMARY OF THE INVENTION

Broadly speaking, the present invention fills this need by providing an S asymmetrically doped memory cell that can be randomly programmed or erased. A method for making such a memory cell is also disclosed.

In accordance with one aspect of the present invention, an asymmetrically doped memory cell is provided. The asymmetrically doped memory cell has first and second impurity doped junctions on a substrate. A composite charge trapping layer is defined over the substrate and between the first and the second impurity doped junctions. A first impurity doped region is positioned adjacent to the first impurity doped junction and under the composite charge trapping layer. A second impurity doped region is positioned adjacent to the second impurity doped junction and under the composite charge trapping layer. The first and the second impurity doped junctions and the first impurity doped region have a first polarity, while the second impurity doped region has a second polarity that is opposite to the first polarity.

The disclosed asymmetrically doped memory cell stores charges at the end of the composite charge trapping layer that is above the second impurity doped region. It can be randomly programmed or erased, thus, it can function as an electrically erasable and programmable read only memory (EEPROM) cell.

In accordance with another aspect of the present invention, an asymmetrically doped memory structure is provided. The asymmetrically doped memory structure comprises a first and a second asymmetrically doped memory cells.

The first asymmetrically doped memory cell includes first and second impurity doped junctions on a substrate. A first composite charge trapping layer is defined over the substrate and between the first and the second impurity doped junctions. A first impurity doped region is positioned adjacent to the first impurity doped junction and under the first composite charge trapping layer. A second impurity doped region is positioned adjacent to the second impurity doped junction and under the first composite charge trapping layer.

The second asymmetrically doped memory cell includes the second impurity doped junction and a third impurity doped junction on the substrate. A second composite charge trapping layer is defined over the substrate and between the second and the third impurity doped junctions. A third impurity doped region is positioned adjacent to the second impurity doped junction and under the second composite charge trapping layer. A fourth impurity doped region is positioned adjacent to the third impurity doped junction and under the second composite charge trapping layer.

The first, the second, and the third impurity doped junctions have a first polarity, while the second and the fourth impurity doped regions have a second polarity that is opposite to the first polarity. The first and the third impurity doped regions have the first polarity.

In accordance with yet another aspect of the present invention, a method for making an asymmetrically doped memory cell is provided. In this method, first and second impurity doped junctions are formed on a substrate. A composite charge trapping layer is disposed over the substrate and positioned between the first and the second impurity doped junctions. A first impurity doped region is formed adjacent to the first impurity doped junction and under the composite charge trapping layer, then a second impurity doped region in formed adjacent to the second impurity doped junction and under the composite charge trapping layer. The first and the second impurity doped junctions and the first impurity doped region have a first polarity, while the second impurity doped region has a second polarity that is opposite to the first polarity.

The first impurity doped region can be formed either by a pocket implant method or a double diffusion method. The second impurity doped region is formed by a pocket implant method.

The asymmetrically doped memory cell can be programmed with a channel hot electron programming method, and can be erased by a band-to-band hot hole erasing scheme. It can be read either by a reverse or forward read method.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

FIG. 3 illustrates a table showing the voltage biases applied to a selected asymmetrically doped memory cell and its neighboring cell during its program, erase, and read operations in accordance with one embodiment of the present invention.

DETAILED DESCRIPTION OF THE EXEMPLARY EMBODIMENTS

Reference is made in detail to embodiments of the invention. While the invention is described in conjunction with the embodiments, the invention is not intended to be limited by these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as will be apparent to one having ordinary skill in the art, the invention may be practiced without these specific details. In other instances, well-known methods, procedures, components, and circuits have not been described in detail so that aspects of the invention will not be obscured.

Figure 1:
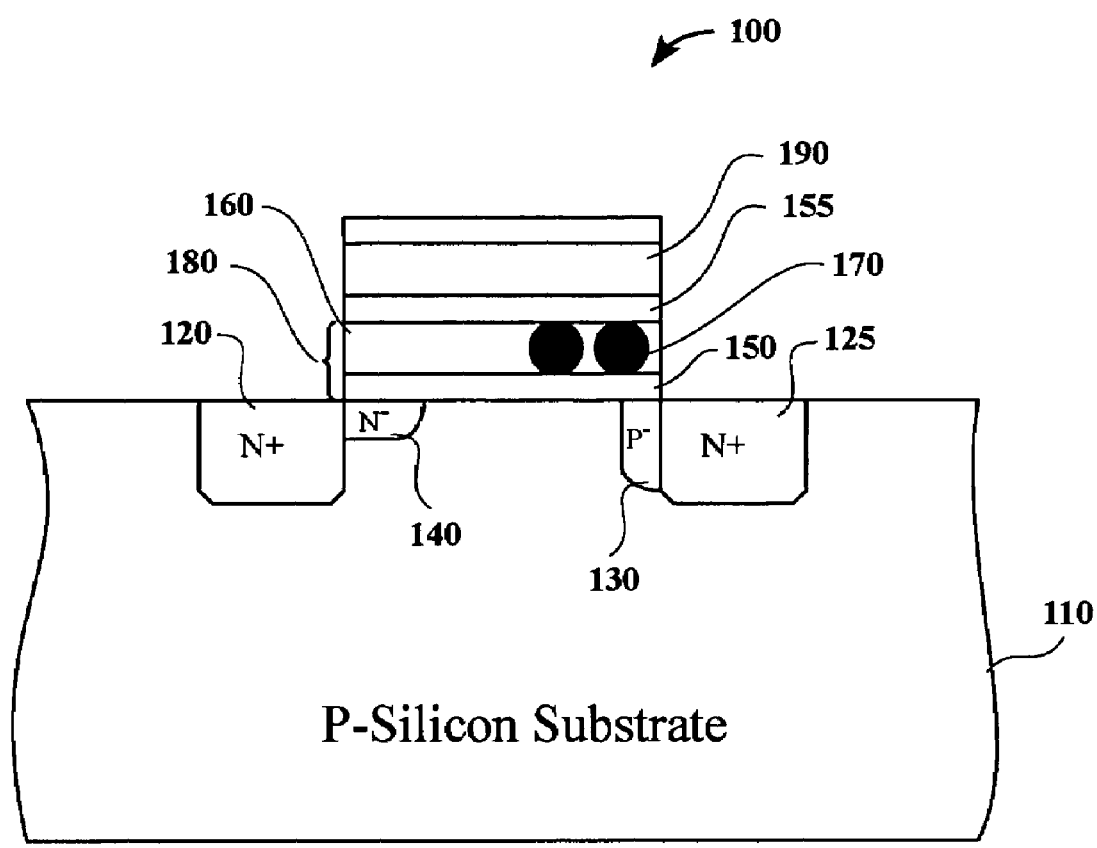
FIG. 1 illustrates a cross-sectional view of an asymmetrically doped memory cell in accordance with one embodiment of the present invention.

FIG. 1 illustrates a cross-sectional view of an asymmetrically doped memory cell 100 in accordance with one embodiment of the present invention. The asymmetrically doped memory cell 100 includes a P silicon substrate 110 with two N+ doped junctions 120 and 125. A composite charge trapping layer 180 is defined over the P silicon substrate and between the two N+ doped junctions 120 and 125. As shown, the composite charge trapping layer 180 includes two dielectric layers 150 and 155 and one charge trapping layer 160, wherein the charge trapping layer 160 is sandwiched between the two dielectric layers 150 and 155. In one embodiment, the composite charge trapping layer is a composite oxide-nitride-oxide (ONO) layer, i.e., each of the dielectric layers is an oxide layer, and the charge trapping layer is a nitride layer. A P– doped region 130 is positioned under the composite charge trapping layer 180 and adjacent to the N+ doped junction 125, while a N– doped region 140 is positioned under the composite charge trapping layer 180 and adjacent to the N+ doped junction 120. A polysilicon gate 190, functioning as a word line, is disposed over the composite charge trapping layer 180.

After the asymmetrically doped memory cell 100 is programmed, charges 170 are stored toward the end of the charge trapping layer 160 that is above the P– doped region 130. Only one end of the charge trapping layer 160 (the end over the P– doped region 130) is used to store charges for this asymmetrically doped memory cell 100 due to its asymmetrically doped structure. The asymmetrically doped memory cell 100 is programmed by the channel hot electron (CHE) programming method, and is erased by the band-to-band tunneling hot hole (BTBT HH) erase scheme.

Based on the structure of silicon-oxide-nitride-oxide-semiconductor (SONOS), the asymmetrically doped memory cell 100 is similar to a nitride read only memory (NROM) cell in structure except for its asymmetrically doped regions: the P– doped region 130 and the N– doped region 140.

For the N+ doped junction 125, due to the adjacent P– doped region 130, its energy bands (valence band and the conduction band) are further bended. As a result, the local electrical field for hot electron generation during a CHE programming operation is increased, and the gate induced drain leakage (GIDL) effect for band to band hot hole generation during a BTBT HH erase operation is improved. Therefore, the P– doped region can significantly enhance the generation efficiency of the CHE programming and the BTBT HH erase at the N+ doped junction 125 of the asymmetrically doped memory cell 100.

Because the asymmetrically doped memory cell 100 only stores charges at one side, the second bit effect is avoided. By using the CHE programming method to precisely program the amount of charges, the asymmetrically doped memory cell 100 can store multiple-level charges at the end of the charge trapping layer 160 that is above the P– doped region 130. Thus, the asymmetrically doped memory cell 100 is capable of the multiple level cell (MLC) operation.

In one embodiment, the dosage needed for respectively forming the P– doped region 130 and the N– doped region 140 is about 1E12 cm$^{-2}$ to about 5E13 cm$^{-2}$. In another embodiment, the P– doped region 130 and the N– doped region 140 are formed by the pocket implant method. In yet another embodiment, the N– doped region 140 is formed by the double diffusion method.

Figure 2:
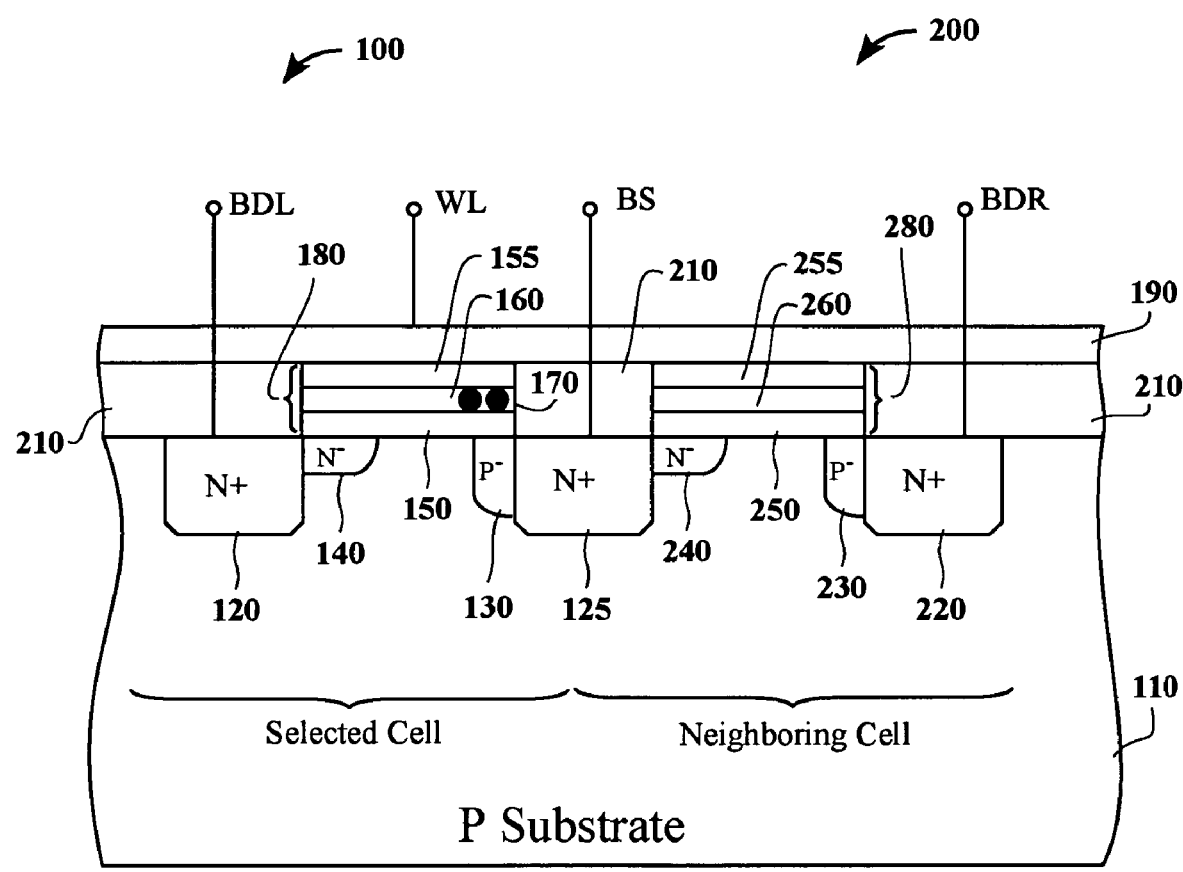
FIG. 2 illustrates a cross-sectional view of an asymmetrically doped memory structure in accordance with one embodiment of the present invention.

FIG. 2 illustrates a cross-sectional view of an asymmetrically doped memory structure in accordance with one embodiment of the present invention. The asymmetrically doped memory structure includes two asymmetrically doped memory cells 100 and 200. The BDL and the BS are bit line terminals for the asymmetrically doped memory cell 100, while the BS and the BDR are bit line terminals for the asymmetrically doped memory cell 200. The WL is the word line terminal that is shared by both the asymmetrically doped memory cells 100 and 200. As shown, the two asymmetrically doped memory cells 100 and 200 also share the bit line terminal BS and the N+ doped junction 125.

For this embodiment, the asymmetrically doped memory cell 100 is the selected cell, whereas the asymmetrically doped memory cell 200 is the neighboring cell. The selected cell can be programmed, erased, or read.

The asymmetrically doped memory cell 200, the neighboring cell, includes two N+ doped junctions 125 and 220 on the substrate 110. A composite charge trapping layer 280, including a charge trapping layer 260 sandwiched by two dielectric layers 250 and 255, is disposed over the substrate and between the two N+ doped junctions 125 and 220.

For the two asymmetrically doped memory cells 100 and 200, their composite charge trapping layers 180 and 280 are isolated by oxide regions 210. The polysilicon layer 190, i.e., the word line, is formed over the oxide regions and the composite charge trapping layers 180 and 280.

FIG. 3 illustrates a table 300 showing the voltage biases applied to the selected cell and its neighboring cell in FIG. 2 during the program, erase, and read operations of the selected cell in accordance with one embodiment of the present invention.

For the BTBT HH erase operation of the selected cell, the BS terminal is applied with 5V, the WL terminal is applied with –5V, and the BDL terminal is grounded. For the CHE programming operation of the selected cell, the BS terminal is applied with 5V, the WL terminal is applied with 10V, and the BDL terminal is grounded. For the forward read operation of the selected cell, the BS terminal is applied with 1V, the WL terminal is applied with 5V, and the BDL terminal is grounded. For the reverse read operation of the selected cell, the BDL terminal is applied with 1V, the WL terminal is applied with 5V, and the BS terminal is grounded. For all of the erase, program, and read (forward and reverse) operations of the selected cell, the BDR terminal of the neighboring cell is floating.

Due to the N– doped region 240 of the neighboring cell and its floating bit line terminal BDR, the unselected neighboring cell will not be able to generate hot electrons or hot holes at the given program or erase voltage bias conditions for the selected cell. Therefore, during the program or erase operation of the selected cell, the unselected neighboring cell will not be affected. The dosage of the N– doped region 240 of the neighboring cell can be adjusted to significantly suppress the erase and program disturbs of the selected cell.

In order to avoid the punch through issue due to the asymmetrically doped structure of the selected cell, especially at the N– doped region 140, we can increase the dosage for the P– doped region 130 under the breakdown concern to enhance the generation speed of the hot electrons and the hot holes for the program and erase operations of the selected cell.

As shown from the table 300 of FIG. 3, low bit line read voltage (1V) is applied to the bit line terminal (BS or BDL) for both the forward and the reverse read operations, which makes the selected cell avoid the read disturb problem. The bit line read voltage could be less than 1V in an alternative embodiment.

Unlike a conventional electrically erasable programmable read only memory (EEPROM) array, no isolation field oxide regions and isolation electrical lines are need between two asymmetrically doped memory cells for an asymmetrically doped memory array. No isolation field oxide regions can increase memory array density. No isolation electrical lines can reduce the bank selection transistors and the associated overhead area, which leads to increased core efficiency. In addition, without the isolation field oxide regions and isolation electrical lines, an asymmetrically doped memory array can achieve a flat array surface.

One feature of the disclosed asymmetrically doped memory cell is its small cell size. The SONOS based asymmetrically doped memory cell is capable of random programming or erasing, i.e., an asymmetrically doped memory cell can be programmed or erased individually. Hence, the asymmetrically doped memory cell can function as an EEPROM cell alone without the traditional select transistor used by a conventional EEPROM cell, by storing the charges at one side of the charge trapping layer that is above the P– doped region. In addition, due to the shared junctions and bit line terminals for an asymmetrically doped memory array, the size of an asymmetrically doped memory cell can be further reduced without the concern of the second bit effect.

Another feature of the asymmetrically doped memory cell is it single poly process. Because the disclosed asymmetrically doped memory cell stores the charges at a charge trapping layer instead of at a polysilicon floating gate of a conventional EEPROM cell, only one poly process is need for fabricating the SONOS based asymmetrically doped memory cell, which simplifies the process procedure and makes it easy to integrate with complementary metal oxide semiconductor (CMOS) logic process. The simplified fabrication process leads to low cost production of the asymmetrically doped memory cell as well.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A memory cell, comprising:
   a substrate;
   first and second impurity doped junctions on the substrate, the first and the second impurity doped junctions having a first polarity;
   a composite charge trapping layer defined over the substrate and between the first and the second impurity doped junctions, the composite charge trapping layer including a nonconductive charge trapping layer sandwiched between two dielectric layers, wherein charges of the memory cell are stored at an end of the nonconductive charge trapping layer that is above the second impurity doped region after the memory cell is programmed;
   a first impurity doped region positioned adjacent to the first impurity doped junction and under the composite charge trapping layer and having the first polarity; and
   a second impurity doped region being positioned adjacent to the second impurity doped junction and under the composite charge trapping layer and having a second polarity, wherein the second polarity is opposite to the first polarity.

2. The memory cell as recited in claim 1, further comprising: a polysilicon gate being defined over the composite charge trapping layer.

3. The memory cell as recited in claim 1, wherein each of the first and the second impurity doped regions has a dosage ranged from about $1E1cm^{-2}$ to about $5E13cm^{-2}$.

4. The memory cell as recited in claim 1, wherein the composite charge trapping layer includes a nitride layer and two oxide layers, and the nitride layer is sandwiched between the two oxide layers.

5. The memory cell as recited in claim 1, wherein the charges of the memory cell stored at the end of the nonconductive charge trapping layer that is above the second impurity doped region can be programmed such that multiple level cell (MLC) operations can be performed.

6. The memory cell as recited in claim 1, wherein the charges of the memory cell stored at the end of the nonconductive charge trapping layer that is above the second impurity doped region are programmed by a channel hot electron programming method.

7. The memory cell as recited in claim 1, wherein the charges of the memory cell stored at the end of the nonconductive charge trapping layer that is above the second impurity doped region are erased by a band-to-band hot hole erase scheme.

8. The memory cell as recited in claim 1, wherein the charges of the memory cell stored at the end of the nonconductive charge trapping layer that is above the second impurity doped region are either read by a forward reading method by applying a bit line read voltage to a second terminal that is connected with the second impurity doped junction, or read by a reverse read method by applying the bit line read voltage to a first terminal that is connected with the first impurity doped junction.

9. The memory cell as recited in claim 8, wherein the bit line read voltage is about less or equal to 1V.

10. The memory cell as recited in claim 1, wherein the first and the second impurity doped junctions are N+ doped junctions.

11. The memory cell as recited in claim 1, wherein the first impurity doped region is a N− doped region.

12. The memory cell as recited in claim 1, wherein the second impurity doped region is a P− doped region.

13. The memory cell as recited in claim 1, wherein the substrate is a P substrate.

14. A memory structure, comprising:
a first memory cell, wherein the first memory cell includes:
a substrate;
a first impurity doped junction and a second impurity doped junction on a substrate, the first impurity doped junction and the second impurity doped junction having a first polarity;
a first composite charge trapping layer being defined over the substrate and between the first impurity doped junction and the second impurity doped junction;
a first impurity doped region being positioned adjacent to the first impurity doped junction and under the first composite charge trapping layer and having the first polarity;
a second impurity doped region being positioned adjacent to the second impurity doped junction and under the first composite charge trapping layer and having a second polarity, wherein the second polarity is opposite to the first polarity; and
a second memory cell, wherein the second memory cell includes: the second impurity doped junction and a third impurity doped junction on the substrate, the third impurity doped junction having the first polarity;
a second composite charge trapping layer being defined over the substrate and between the second impurity doped junction and the third impurity doped junction;
a third impurity doped region being positioned adjacent to the second impurity doped junction and under the second composite charge trapping layer and having the first polarity;
a fourth impurity doped region being positioned adjacent to the third impurity doped junction and under the second composite charge trapping layer and having the second polarity,
wherein each of the first and second composite charge trapping layers includes a charge trapping layer sandwiched between two dielectric layers.

15. The memory structure as recited in claim 14, further comprising: three oxide regions being positioned adjacent to each sidewalls of the first and the second composite charge trapping layers; and a polysilicon layer being defined over the three oxide regions and the first and the second composite charge trapping layers.

16. The memory structure as recited in claim 14, wherein each of the first, the second, the third, and the fourth impurity doped regions has a dosage ranged from about $1E12 cm^{-2}$ to about $5E13 cm^{-2}$.

17. The memory structure as recited in claim 14, wherein each of the first and the second composite charge trapping layers includes a nitride layer and two oxide layers, the nitride layer is sandwiched by the two oxide layers.

18. The memory structure as recited in claim 17, wherein charges of the first memory cell is stored at an end of the nitride layer of the first composite charge trapping layer that is above the second impurity doped region after the first memory cell is programmed.

19. The memory structure as recited in claim 17, wherein charges of the second memory cell is stored at an end of the nitride layer of the second composite charge trapping layer that is above the fourth impurity doped region after the second memory cell is programmed.

20. The memory structure as recited in claim 14, wherein the first and the second memory cell are capable of multiple level cell operations.

21. The memory structure as recited in claim 14, wherein each of the first and the second memory cells is programmed by a channel hot electron programming method.

22. The memory structure as recited in claim 14, wherein each of the first and the second memory cells is erased by a band-to-band hot hole erasing scheme.

23. The memory structure as recited in claim 14, wherein each of the first and the second memory cells is read by a forward or reverse read method.

24. The memory structure as recited in claim 14, wherein when the first memory cell is programmed, or erased, or read, a terminal that is connected to the third impurity doped region of the second memory cell is floating.

25. The memory structure as recited in claim 14, wherein the first, the second, and the third impurity doped junctions are N+ doped junctions.

26. The memory structure as recited in claim 14, wherein each of the first and the third impurity doped regions is a N− doped region.

27. The memory structure as recited in claim 14, wherein each of the second and the fourth impurity doped regions is a P− doped region.

28. The memory structure as recited in claim 14, wherein the substrate is a P substrate.

29. A memory cell, comprising:
a substrate;
first and second impurity doped junctions on the substrate, the first and the second impurity doped junctions having a first polarity;
a composite charge trapping layer defined over the substrate and between the first and the second impurity doped junctions, the composite charge trapping layer including a non-conductive charge trapping layer sandwiched between two dielectric layers;
a first impurity doped region positioned adjacent to the first impurity doped junction and under the composite charge trapping layer and having the first polarity; and
a second impurity doped region being positioned adjacent to the second impurity doped junction and under the composite charge trapping layer and having a second polarity, wherein the second polarity is opposite to the first polarity,
wherein the first impurity doped region has a first depth less than a second depth of the second impurity doped region.

30. The memory cell as recited in claim 29, further comprising: a polysilicon gate being defined over the composite charge trapping layer.

31. The memory cell as recited in claim 29, wherein each of the first and the second impurity doped regions has a dosage ranged from about $1E12 cm^{-2}$ to about $5E13 cm^{-2}$.

32. The memory cell as recited in claim 29, wherein the composite charge trapping layer includes a nitride layer and two oxide layers, and the nitride layer is sandwiched between the two oxide layers.

33. The memory cell as recited in claim 29, wherein charges of the memory cell are stored at an end of the nonconductive charge trapping layer that is above the second impurity doped region after the memory cell is programmed.

34. The memory cell as recited in claim 29, wherein the charges of the memory cell stored at the end of the nonconductive charge trapping layer that is above the second impurity doped region can be programmed such that multiple level cell (MLC) operations can be performed.

35. The memory cell as recited in claim 29, wherein the charges of the memory cell stored at the end of the nonconductive charge trapping layer that is above the second impurity doped region are programmed by a channel hot electron programming method.

36. The memory cell as recited in claim 29, wherein the charges of the memory cell stored at the end of the nonconductive charge trapping layer that is above the second impurity doped region are erased by a band-to-band hot hole erase scheme.

37. The memory cell as recited in claim 29, wherein the charges of the memory cell stored at the end of the nonconductive charge trapping layer that is above the second impurity doped region are either read by a forward reading method by applying a bit line read voltage to a second terminal that is connected with the second impurity doped junction, or read by a reverse read method by applying the bit line read voltage to a first terminal that is connected with the first impurity doped junction.

38. The memory cell as recited in claim 37, wherein the bit line read voltage is about less or equal to IV.

39. The memory cell as recited in claim 29, wherein the first and the second impurity doped junctions are N+ doped junctions.

40. The memory cell as recited in claim 29, wherein the first impurity doped region is a N− doped region.

41. The memory cell as recited in claim 29, wherein the second impurity doped region is a P− doped region.

42. The memory cell as recited in claim 29, wherein the substrate is a P substrate.

* * * * *